United States Patent
Dhasmana et al.

(10) Patent No.: US 10,514,742 B2
(45) Date of Patent: Dec. 24, 2019

(54) POWER DOWN SIGNAL GENERATING CIRCUIT

(71) Applicant: NXP B.V., Eindhoven (NL)

(72) Inventors: Jitendra Dhasmana, Bangalore (IN); Mansi Rastogi, Bangalore (IN)

(73) Assignee: NXP B.V., Eindhoven (NL)

( * ) Notice: Subject to any disclaimer, the term of this patent is extended or adjusted under 35 U.S.C. 154(b) by 208 days.

(21) Appl. No.: 15/857,480

(22) Filed: Dec. 28, 2017

(65) Prior Publication Data
US 2019/0204891 A1    Jul. 4, 2019

(51) Int. Cl.
*G06F 1/32* (2019.01)
*G06F 1/3203* (2019.01)
*H02J 9/00* (2006.01)
*H02M 1/00* (2006.01)

(52) U.S. Cl.
CPC .......... *G06F 1/3203* (2013.01); *H02J 9/005* (2013.01); *H02M 2001/0032* (2013.01)

(58) Field of Classification Search
CPC .......... G06F 1/3203; G06F 1/32; H02J 9/005; H02J 9/00; H02M 2001/0032
See application file for complete search history.

(56) References Cited

U.S. PATENT DOCUMENTS

| | | |
|---|---|---|
| 5,935,253 A | 8/1999 | Conary |
| 6,563,746 B2 | 5/2003 | Fujioka |
| 6,650,594 B1 | 11/2003 | Lee |
| 6,906,582 B2 | 6/2005 | Kase |
| 7,080,341 B2 | 7/2006 | Eisenstadt et al. |
| 8,624,627 B1 | 1/2014 | Jarrer et al. |
| 9,391,602 B1 * | 7/2016 | Kasanyal ............. H03K 17/162 |
| 9,419,621 B1 | 8/2016 | Rohleder et al. |
| 9,772,668 B1 | 9/2017 | Soebroto et al. |
| 2009/0256607 A1 | 10/2009 | Smith |
| 2010/0181839 A1 * | 7/2010 | Takahashi ............. G06F 1/3203 307/80 |
| 2010/0194200 A1 * | 8/2010 | Kwon ....................... G06F 1/24 307/52 |
| 2012/0146727 A1 * | 6/2012 | Cyrusian ............... H03F 3/2173 330/261 |
| 2015/0048813 A1 * | 2/2015 | Hidaka .......... H03K 19/018521 323/312 |

* cited by examiner

*Primary Examiner* — Fahmida Rahman

(57) ABSTRACT

A power-down signal generating circuit receives first and second supply voltages, where the first supply voltage is less than the second supply voltage, and generates a power-down signal. The power-down signal generating circuit includes a driving amplifier, first through third transistors, and an amplification circuit. When the first supply voltage is deactivated, the power-down signal is activated. The driving amplifier prevents the first through third transistors from being enabled simultaneously, which reduces static leakage current.

18 Claims, 4 Drawing Sheets

POWER DOWN SIGNAL GENERATING CIRCUIT

BACKGROUND

The present invention relates generally to electronic circuits, and more particularly, to a power-down signal generating circuit.

Integrated circuits (ICs) include different power domains such as a "core" domain and an "input-output" (IO) domain. The core domain includes a primary power supply and functional circuitry. The primary power supply generates and provides a supply voltage to the core domain. The functional circuitry includes interconnected components such as a processor, a clock generator, and a memory, and generates functional signals.

The IO domain is an I/O interface powered by an IO domain power supply, which generates a secondary supply voltage. The secondary supply voltage usually is at a higher voltage level than the primary supply voltage. The IO domain includes an IO ring that receives the functional signals from the core domain and transmits them to an external circuit or device. When the core is disabled, i.e., when the primary supply voltage is deactivated, the IO domain should switch to a stand-by mode to conserve power. However, as the IO domain does not receive the deactivated primary supply voltage, it may continue to transmit functional signals even when the core is disabled, which causes unnecessary power consumption.

To avoid the aforementioned problem, the IO domain includes a power-down signal generating circuit that generates a power-down signal that indicates if the primary supply voltage has been deactivated. When the primary supply voltage is deactivated, the power-down signal is activated, which switches the IO domain to stand-by mode.

FIG. 1 shows a conventional power-down signal generating circuit 100, which in this case is for an IO ring (not shown) of an IC. The power-down signal generating circuit 100 includes first through fourth transistors 102-108, an amplification circuit 110, and first and second ESD protection circuits 112 and 114. The transistors 102-108 have their gates connected to a first supply voltage VDD by way of the first electrostatic discharge (ESD) protection circuit 112. The first ESD protection circuit 112 receives the first supply voltage VDD from a primary power supply (not shown).

The four transistors 102-108 are connected in series between a second supply voltage VDDE and ground (GND), with first through fourth control signals CS1-CS4 being generated at the drains of the respective first through fourth transistors 102-108. The first through third transistors 102-106 are PMOS pull-up transistors that have weak pull-up and high resistance, while the fourth transistor 108 is an NMOS transistor. A resistor 116 is connected between the drains of the third and fourth transistors 106 and 108.

When the first supply voltage VDD is activated, the first through fourth transistors 102-108 are enabled, which activates the first and second control signals CS1 and CS2, and deactivates the third and fourth control signals CS3 and CS4. More particularly, the first and second control signals CS1 and CS2 acquire an intermediate voltage level between the second supply voltage VDDE and GND, and the third and fourth control signals CS3 and CS4 are pulled to GND. When the first supply voltage VDD is deactivated, the first through third transistors 102-106 are enabled and the fourth transistor 108 is disabled. Thus, the first through fourth control signals CS1-CS4 are activated, i.e., the first through fourth control signals CS1-CS4 are pulled-up to the voltage level of the second supply voltage VDDE.

The amplification circuit 110 is connected directly to the drains of the third and fourth transistors 106 and 108 to receive the third and fourth control signals CS3 and CS4, respectively. The amplification circuit 110 generates a power-down signal CPD. When the third and fourth control signals CS3 and CS4 are inactive, the power-down signal CPD is deactivated, and when the third and fourth control signals CS3 and CS4 are active, the power-down signal CPD is activated and the IO ring switches to a stand-by mode until the power-down signal CPD is deactivated.

A capacitor 118 is connected between the second supply voltage VDDE and the drain of the third transistor 106 (i.e., the node at which CS3 is provided). A fifth transistor 120 has gate, source, and drain terminals connected to the drain terminal of the fourth transistor 108, the drain terminal of the second transistor 104, and a source terminal of a sixth transistor 120, respectively. The sixth transistor 120 has a drain connected to ground (GNDE), and a gate connected to the second ESD protection circuit 114.

When the first supply voltage VDD is activated, the first through fourth transistors 102-108 are simultaneously enabled due to which there is a static leakage current of several micro-amperes, which is disadvantageous, especially in low-power (battery operated) devices, where the static leakage current leads to an increase in the static power consumption. Further, at lower operating voltages, the first through third transistors 102-106 exhibit low switching speed due to the resistance offered by the first through third transistors 102-106. The low switching speed of the first through third transistors 102-106 reduces the operating speed of the power-down signal generating circuit 100.

Therefore, it would be advantageous to have a power-down signal generating circuit with less static leakage current and static power consumption.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a power-down signal generating circuit. The power-down signal generating circuit includes a driving amplifier circuit, first through third transistors, and an amplification circuit. The driving amplifier circuit receives first and supply voltages, and outputs an amplified version of the first supply voltage. The first transistor has a gate terminal connected to the driving amplifier circuit for receiving the amplified version of the first supply voltage, a source terminal for receiving the second supply voltage, and a drain terminal for outputting a first control signal. The second transistor has a gate terminal connected to the driving amplifier circuit for receiving the amplified version of the first supply voltage, a source terminal connected to the drain terminal of the first transistor for receiving the first control signal, and a drain terminal for outputting a second control signal. The third transistor has a gate terminal for receiving the first supply voltage, and a drain terminal for outputting a third control signal. The first and second transistors are disabled and the third transistor is enabled when the first supply voltage is activated. The amplification circuit is connected to the drain terminals of the second and third transistors for receiving the second and third control signals, respectively, and outputs a power-down signal. The power-down signal is activated when the first supply voltage is deactivated.

In an embodiment of the present invention, the driving amplifier circuit comprises a differential amplifier circuit, a common source amplifier, and a resistor divider. The differential amplifier circuit receives the first and second supply voltages and a feedback signal, and generates an intermediate signal. The common source amplifier receives the intermediate signal and the second supply voltage, and outputs the amplified version of the first supply voltage. The resistor divider receives the amplified version of the first supply voltage and outputs the feedback signal.

Figure 1:
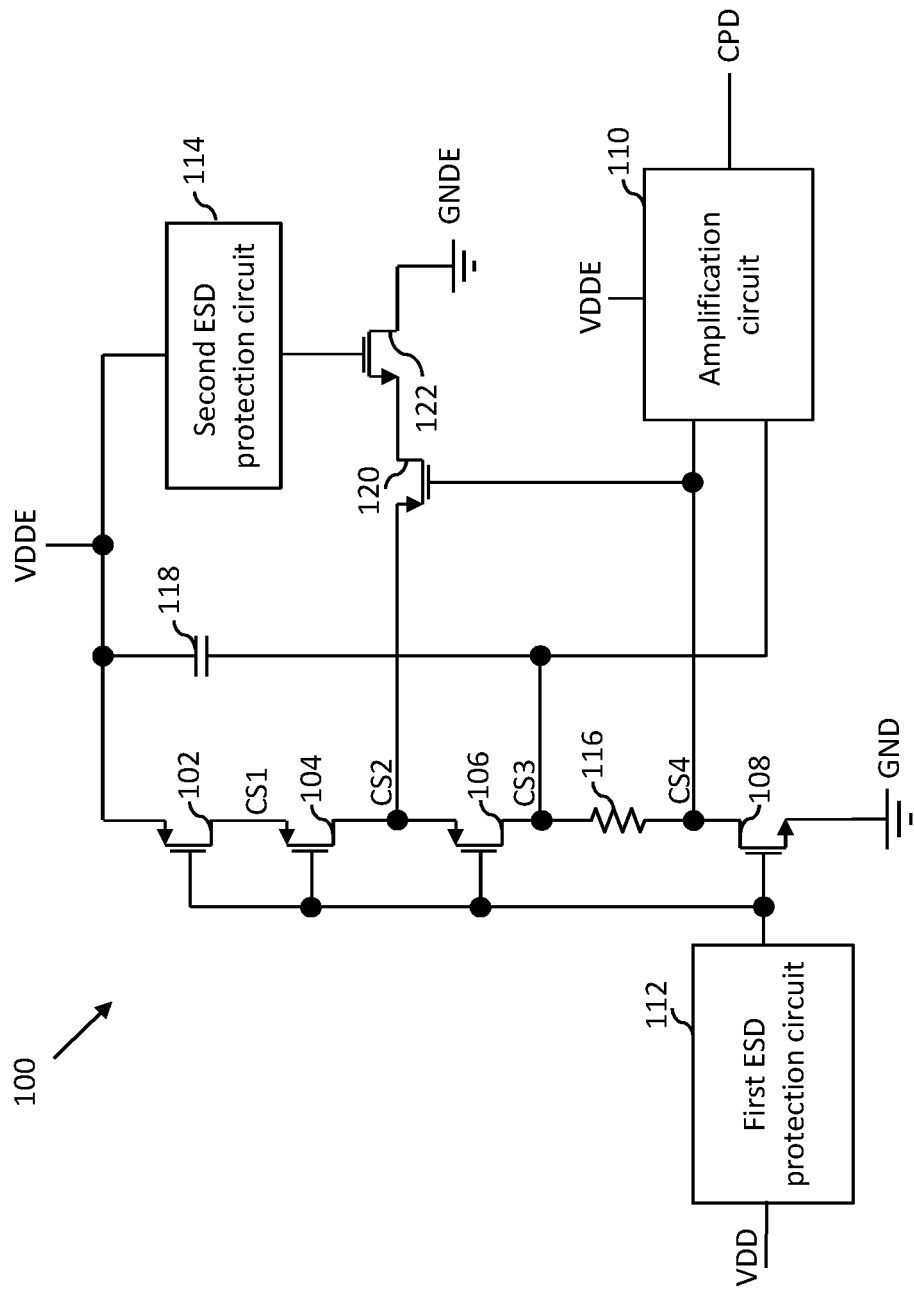
FIG. 1 is a schematic circuit diagram of a conventional power-down signal generating circuit.

Various embodiments of the present invention provide a power-down signal generating circuit. The power-down signal generating circuit preferably is located in an input-output (IO) ring of an integrated circuit (IC). When the power-down signal is activated, the IO ring switches to a stand-by mode and does not draw additional power. When the first supply voltage is activated, the first and second transistors are disabled and the third transistor is enabled. Thus, compared to the conventional power-down signal generating circuit (FIG. 1), the static leakage current in the power-down signal generating circuit reduces and hence the speed of operation of the power-down signal generating circuit is improved at lower voltages. Further, due to the reduction in static leakage current, there is a reduction in static power consumption.

Figure 2:
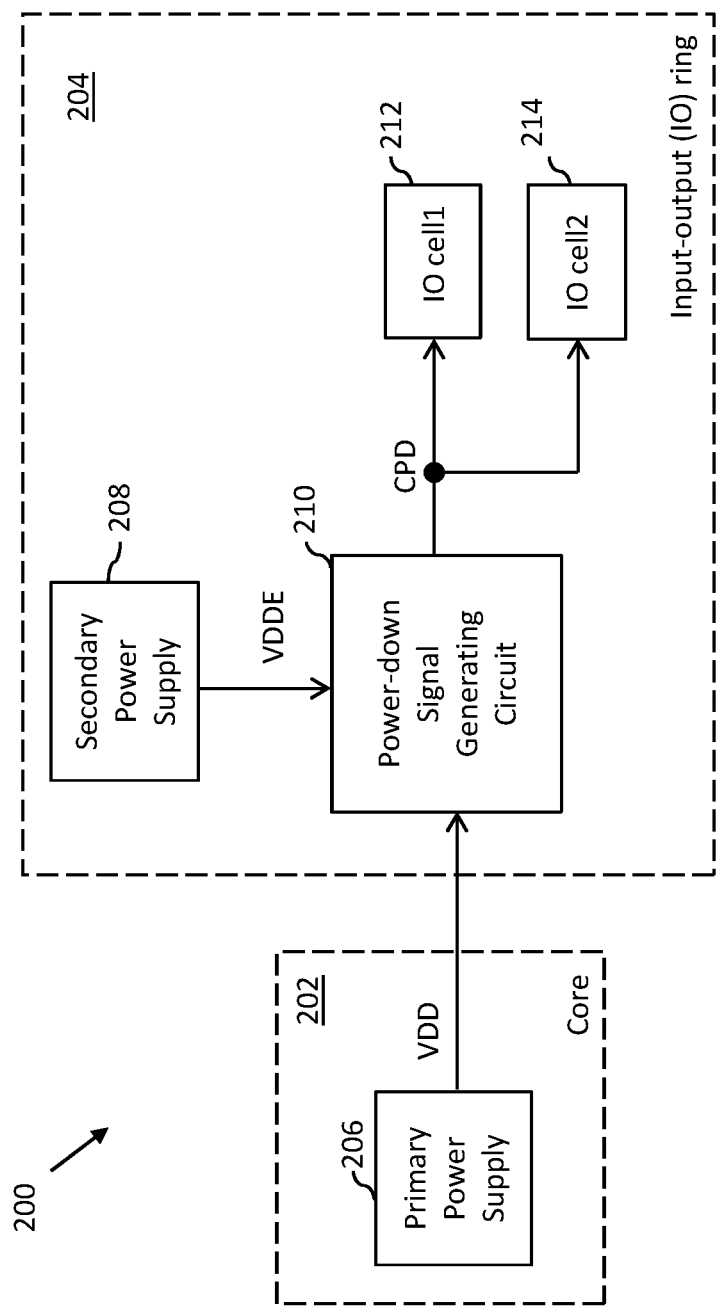
FIG. 2 is a schematic block diagram of an IC in accordance with an embodiment of the present invention.

Referring now to FIG. 2, a block diagram of an integrated circuit (IC) 200 in accordance with an embodiment of the present invention is shown. The IC 200 includes a core domain 202 and an IO domain 204, i.e., an input-output (IO) ring 204. The core domain 202 includes a primary power supply 206 that generates a first supply voltage VDD. The first supply voltage VDD powers the core domain 202.

The IO ring 204 includes a secondary power supply 208, a power-down signal generating circuit 210, and first and second IO cells 212 and 214. The secondary power supply 208 generates a second supply voltage VDDE to power the IO ring 204. The first supply voltage VDD is at a lower voltage level than the second supply voltage VDDE. In one embodiment, the voltage level of the first supply voltage VDD is 1.1 volts (V) and the voltage level of the second supply voltage VDDE is 3.3 V.

The power-down signal generating circuit 210 is connected to the primary and secondary power supplies 206 and 208 and receives the first and second supply voltages VDD and VDDE, respectively. The power-down signal generating circuit 210 generates a power-down signal CPD that is active when the first supply voltage VDD is deactivated, and inactive when the first supply voltage VDD is activated.

The first and second IO cells 212 and 214 are connected to the power-down signal generating circuit 210 to receive the power-down signal CPD. The first and second IO cells 212 and 214 switch to stand-by mode when the power-down signal CPD is activated. When the power-down signal CPD is deactivated, the first and second IO cells 212 and 214 exit the stand-by mode and communicate functional signals (not shown) between the core domain 202 and external components/devices. It will be understood by a person skilled in the art that the IO ring 204 is not limited to having just the first and second IO cells 212 and 214 and may have any number of IO cells.

Figure 3:
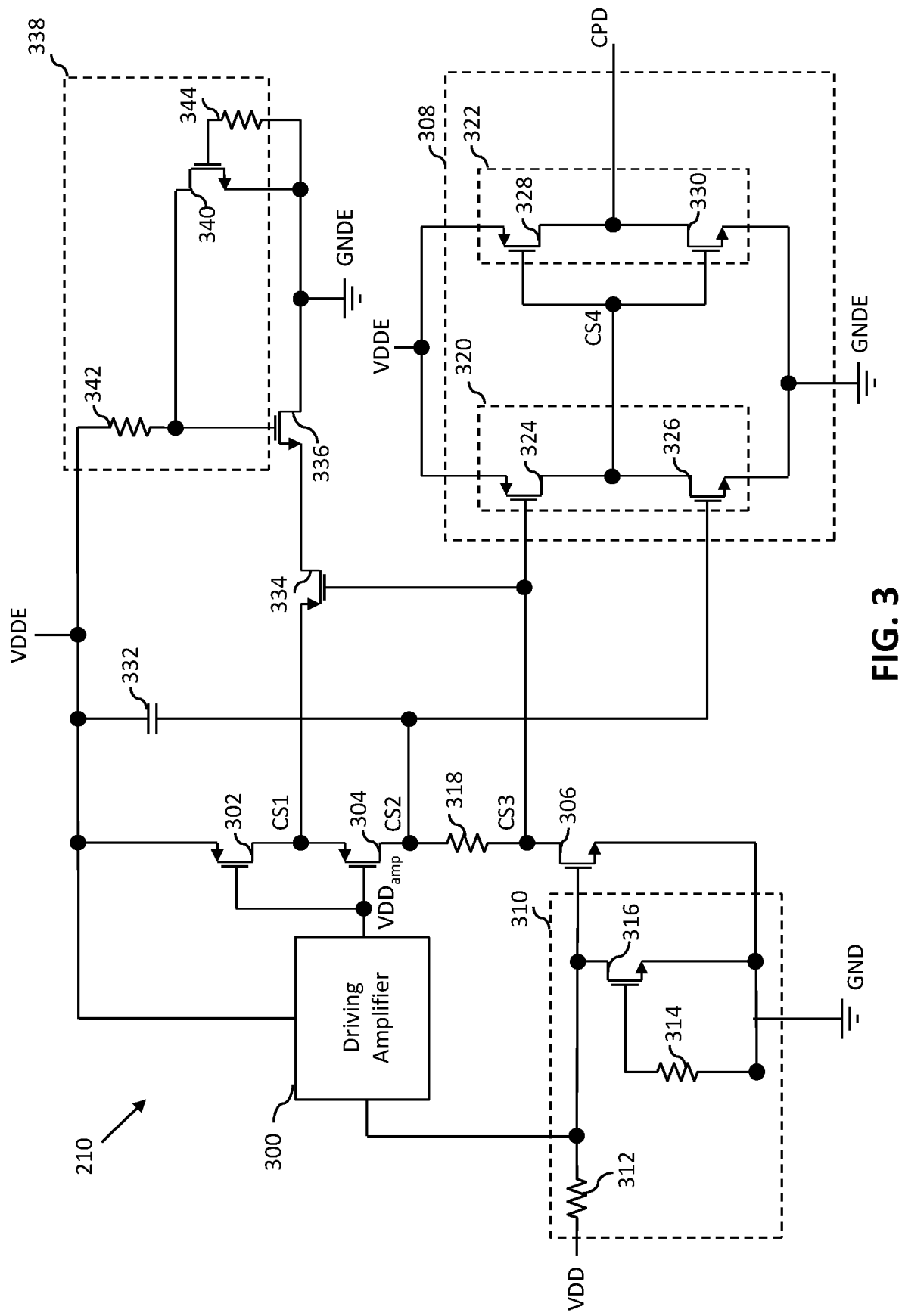
FIG. 3 is a schematic circuit diagram of a power-down signal generating circuit of the IC of FIG. 2 in accordance with an embodiment of the present invention.

Referring now to FIG. 3, a circuit diagram of the power-down signal generating circuit 210 in accordance with an embodiment of the present invention is shown. The power-down signal generating circuit 210 includes a driving amplifier circuit 300 (hereinafter referred to as a "driving amplifier 300"), first through third transistors 302-306, and an amplification circuit 308.

The driving amplifier 300 is a differential amplifier that has a negative feedback loop. The driving amplifier 300 receives the first supply voltage VDD by way of a first electro-static discharge (ESD) protection circuit 310. The driving amplifier 300 also receives the second supply voltage VDDE. In one embodiment, the first ESD protection circuit 310 includes first and second resistors 312 and 314, and a fourth transistor 316. In one embodiment, the fourth transistor 316 is an NMOS transistor.

The first ESD protection circuit 310 protects the driving amplifier 300 from current spikes that may occur due to direct electrical contact of the driving amplifier 300 with the primary power supply 206. The first ESD protection circuit 310 also protects a gate oxide of the third transistor 306 from current spikes that may occur due to direct electrical contact of the third transistor 306 with the primary power supply 206.

The driving amplifier 300 outputs an amplified version of the first supply voltage $VDD_{amp}$ (hereinafter referred to as an "amplified first supply voltage $VDD_{amp}$"). When the first supply voltage VDD is activated, the driving amplifier 300 activates the amplified first supply voltage $VDD_{amp}$ and pulls-up a voltage level of the amplified first supply voltage $VDD_{amp}$ to the voltage level of the second supply voltage VDDE. When the first supply voltage VDD is deactivated, the driving amplifier 300 deactivates the amplified first supply voltage $VDD_{amp}$, i.e., the amplified first supply voltage $VDD_{amp}$ is pulled to ground. The driving amplifier 300 will be explained in conjunction with FIG. 4.

The first transistor 302 has a gate terminal connected to the driving amplifier 300 for receiving the amplified first supply voltage $VDD_{amp}$, a source terminal for receiving the second supply voltage VDDE, and a drain terminal that outputs a first control signal CS1. When the driving amplifier 300 activates the amplified first supply voltage $VDD_{amp}$, the first transistor 302 is disabled. Thus, the first control signal CS1 is deactivated. When the driving amplifier 300 deactivates the amplified first supply voltage $VDD_{amp}$, the first transistor 302 is enabled. When the first transistor 302 is enabled (turned on), the first control signal CS1 is activated and is pulled-up to the voltage level of the second supply voltage VDDE.

The second transistor 304 has a gate terminal connected to the driving amplifier 300 for receiving the amplified first supply voltage $VDD_{amp}$, a source terminal connected to the drain terminal of the first transistor 302 for receiving the first control signal CS1, and a drain terminal that outputs a second control signal CS2. When the driving amplifier 300 activates the amplified first supply voltage $VDD_{amp}$, the second transistor 304 is disabled, which deactivates the second control signal CS2. Conversely, when the driving amplifier 300 deactivates the amplified first supply voltage $VDD_{amp}$, the second transistor 304 is enabled, so the second control signal CS2 is activated and pulled-up to the voltage level of the second supply voltage VDDE. In one embodiment, the first and second transistors 302 and 304 are p-channel metal oxide semiconductor (PMOS) pull-up transistors.

The third transistor 306 has a gate terminal for receiving the first supply voltage VDD by way of the first ESD protection circuit 310. The third transistor 306 has a source terminal connected to ground, and a drain terminal that outputs a third control signal CS3. A third resistor 318 is connected between the drain terminals of the second and third transistors 304 and 306. When the first supply voltage VDD is activated, the third transistor 306 is enabled and deactivates the third control signal CS3. That is, the third transistor 306 pulls-down the third control signal CS3 to ground. When the first supply voltage VDD is deactivated, the third transistor 306 is disabled (turned off). Thus, the third control signal CS3 is activated and gets pulled-up to a voltage level of the second control signal CS2. In one embodiment, the third transistor 306 is an n-channel MOS (NMOS) transistor.

The amplification circuit 308 is connected to the drain terminals of the second and third transistors 304 and 306 for receiving the second and third control signals CS2 and CS3, respectively. The amplification circuit 308 amplifies the second and third control signals CS2 and CS3 to generate the power-down signal CPD.

In one embodiment, the amplification circuit 308 includes first and second inverters 320 and 322, which in one embodiment are CMOS inverters. The first inverter 320 includes fifth and sixth transistors 324 and 326. The second inverter 322 includes seventh and eighth transistors 328 and 330. The fifth and seventh transistors 324 and 328 are PMOS transistors and the sixth and eighth transistors 326 and 330 are NMOS transistors. The first inverter 320 is connected to the drain terminals of the second and third transistors 304 and 306 to receive the second and third control signals CS2 and CS3, respectively. The first inverter 320 generates a fourth control signal CS4. The second inverter 322 is connected to the first inverter 320 to receive the fourth control signal CS4. The second inverter 322 inverts and amplifies the fourth control signal CS4 to generate the power-down signal CPD. When the first supply voltage VDD is deactivated, the second and third control signals CS2 and CS3 are activated, thus the power-down signal CPD is activated. Similarly, when the first supply voltage VDD is activated, the second and third control signals CS2 and CS3 are deactivated, which deactivates the power-down signal CPD.

A capacitor 332 is connected across the first and second transistors 302 and 304. The capacitor 332 prevents occurrence of current spikes when the first and second transistors 302 and 304 toggle between a disabled state and an enabled state. To provide hysteresis in the switching levels of the first supply voltage VDD, a ninth transistor 334 having gate, source, and drain terminals is connected to the drain terminal of the third transistor 306, the drain terminal of the first transistor 302, and a source terminal of a tenth transistor 336, respectively. In one embodiment, the ninth transistor 334 is a PMOS transistor and the tenth transistor 336 is an NMOS transistor. The tenth transistor 336 acts as a switch and avoids an event of latch-up as it connects the drain terminal of the ninth transistor 334 to ground. The tenth transistor 336 has a drain terminal connected to ground and a gate terminal connected to a second ESD protection circuit 338. The second ESD protection circuit 338 protects a gate oxide of the tenth transistor 336 from current spikes that may occur due to direct electrical contact of the tenth transistor 336 with the secondary power supply 208. In one embodiment, the second ESD protection circuit 338 includes an eleventh transistor 340 and fourth and fifth resistors 342 and 344, where the eleventh transistor 340 is an NMOS transistor.

Figure 4:
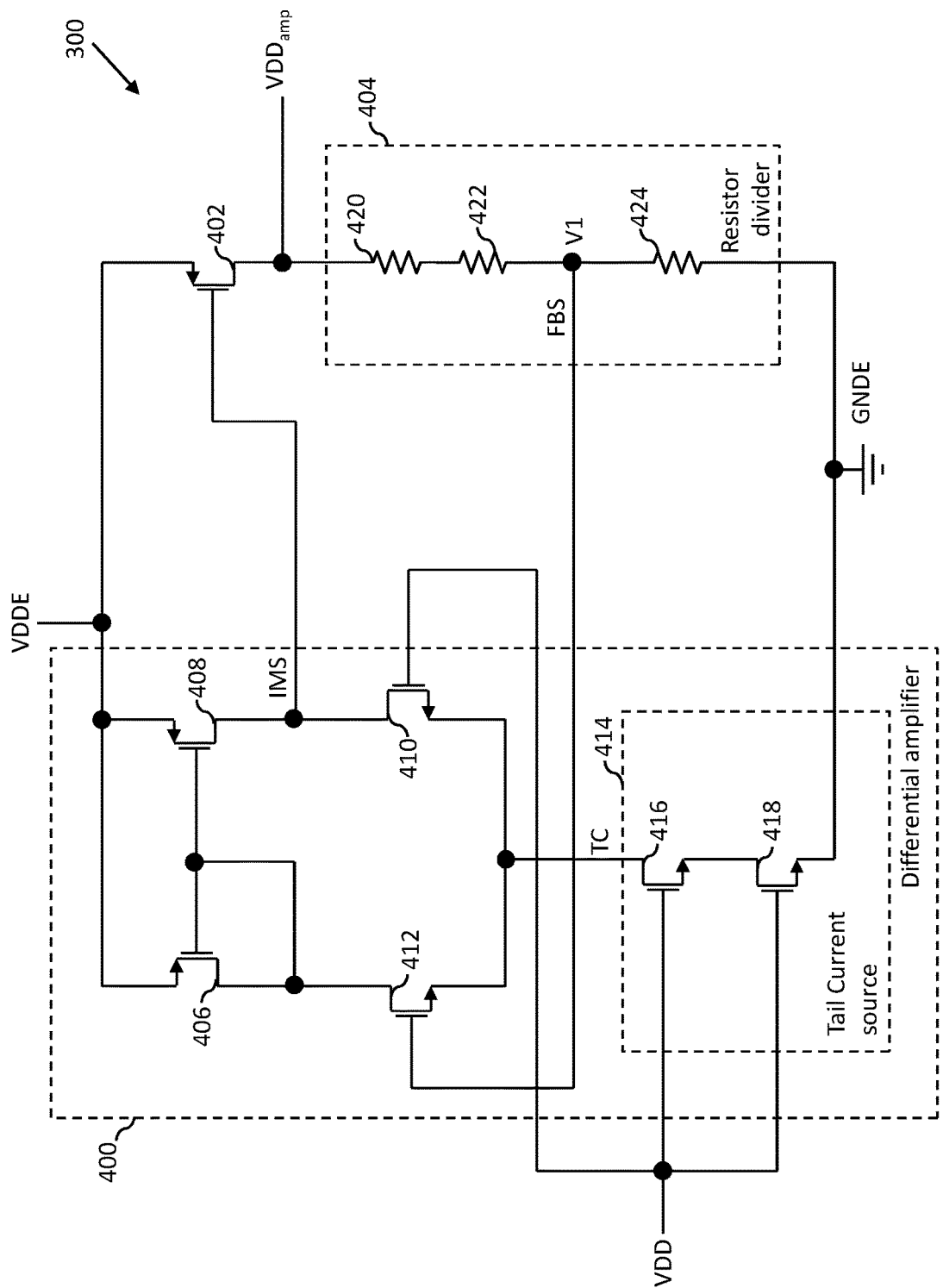
FIG. 4 is a schematic circuit diagram of a driving amplifier of the power-down signal generating circuit of FIG. 3 in accordance with an embodiment of the present invention.

Referring now to FIG. 4, a circuit diagram of the driving amplifier 300 in accordance with an embodiment of the present invention is shown. The driving amplifier 300 is a two-stage amplifier with a first stage as an NMOS input differential amplifier, i.e., a differential amplifier circuit 400, and a second stage as a common source amplifier 402. The driving amplifier 300 further includes a resistor divider 404.

The differential amplifier circuit 400 includes twelfth through fifteenth transistors 406-412, and a tail current source 414. The tail current source 414 includes sixteenth and seventeenth transistors 416 and 418. In an embodiment, the sixteenth and seventeenth transistors 416 and 418 are NMOS transistors. The differential amplifier circuit 400 receives the first and second supply voltages VDD and VDDE and a feedback signal FBS, and outputs an intermediate signal IMS.

The tail current source 414 receives the first supply voltage VDD and outputs a tail current TC. The sixteenth and seventeenth transistors 416 and 418 have gate terminals for receiving the first supply voltage VDD. The seventeenth transistor 418 has a source terminal connected to ground, and a drain terminal connected to a source terminal of the sixteenth transistor 416. A drain terminal of the sixteenth transistor 416 outputs the tail current TC. It will be apparent to a person skilled in the art that to reduce static leakage current in the differential amplifier circuit 400, a low value of the tail current TC is achieved by having large channel lengths of the sixteenth and seventeenth transistors 416 and 418.

The twelfth and thirteenth transistors 406 and 408 have gate terminals connected to each other, and source terminals for receiving the second supply voltage VDDE. The twelfth transistor 406 further has a drain terminal connected to its gate terminal. The thirteenth transistor 408 further has a drain terminal that outputs the intermediate signal IMS. The fourteenth and fifteenth transistors 410 and 412 have gate terminals for receiving the first supply voltage VDD and the feedback signal FBS, respectively, and source terminals connected to each other. The fourteenth and fifteenth transistors 410 and 412 further have drain terminals connected to the drain terminals of the thirteenth and twelfth transistors 408 and 406, respectively. In an embodiment, the twelfth and thirteenth transistors 406 and 408 are PMOS transistors and the fourteenth through seventeenth transistors 410, 412, 416, and 418 are NMOS transistors.

The common source amplifier 402 receives the intermediate signal IMS and outputs the amplified first supply voltage $VDD_{amp}$. In one embodiment, the common source amplifier 402 is a PMOS transistor.

The resistor divider 404 is connected to the common source amplifier 402 for receiving the amplified first supply voltage $VDD_{amp}$. The resistor divider 404 has a voltage tap V1 for outputting the feedback signal FBS. In one embodiment, the resistor divider 404 includes sixth through eighth resistors 420-424. The sixth and seventh resistors 420 and 422 have high resistance values to maintain a voltage level of the feedback signal FBS at the voltage level of the first supply voltage VDD.

When the first supply voltage VDD is activated, the intermediate signal IMS is deactivated. Thus, the common source amplifier 402 is enabled and activates the amplified first supply voltage $VDD_{amp}$, such that the voltage level of the amplified first supply voltage $VDD_{amp}$ is equal to the voltage level of the second supply voltage VDDE. Similarly, when the first supply voltage VDD is deactivated, the intermediate signal IMS is activated and pulled to the voltage level of the second supply voltage VDDE. Thus, the common source amplifier 402 is disabled and de-activates the amplified first supply voltage $VDD_{amp}$.

To maintain the stability of the driving amplifier 300, the dominant pole at an output of the differential amplifier 400 and the parasitic pole at an output of the driving amplifier 300 should be sufficiently apart. The dominant and parasitic poles are kept sufficiently apart by ensuring that the parasitic pole remains at a high frequency as compared to the dominant pole. The parasitic pole is kept at the high frequency by minimizing a load capacitance at the output of the driving amplifier 300. The load capacitance at the output of the driving amplifier 300 is minimized by having lower sizes of the first and second transistors 302 and 304.

It will be apparent to a person skilled in the art that the driving amplifier 300 can be implemented by a different arrangement of transistors or different types of transistors. For example, in one alternate implementation, the driving amplifier 300 may have the first stage as a PMOS input differential amplifier and the second stage as an NMOS common source amplifier.

The implementation of the driving amplifier 300 ensures that the first and second transistors 302 and 304 are disabled and the third transistor 306 is enabled when the first supply voltage VDD is activated. As the first through third transistors 302-306 are not enabled simultaneously, there is no direct signal path between the secondary power supply 208 and ground. Thus, the static leakage current in the power-down signal generating circuit 210 is less than the static leakage current in the conventional power-down signal generating circuit 100. In one embodiment, the static leakage current in the power-down signal generating circuit 210 is less than 1 micro-ampere as compared to 5-6 micro amperes in the conventional power-down signal generating circuit 100. Hence, the first and second transistors 302 and 304 can have shorter channel lengths and strong pull-up, i.e., low resistance, as compared to the first and second transistors 102 and 104 of the conventional power-down signal generating circuit 100.

The reduction in the static leakage current further reduces the static power consumption especially in low-power applications, i.e., battery operated applications. The reduction in static power consumption further leads to reduction in the total power consumption of the IC 200. Due to the strong pull-up of the first and second transistors 302 and 304, the speed of operation of the power-down signal generating circuit 210 at lower voltages is higher as compared to the power-down signal generating circuit 100.

It will be understood by those of skill in the art that the same functions may be performed by different arrangements of transistors that may operate using either high active or low active signals. Therefore, variations in the arrangement of some of the transistors described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A power-down signal generating circuit, comprising:
a driving amplifier circuit that receives a first supply voltage and a second supply voltage, and outputs an amplified version of the first supply voltage;
a first transistor having a gate terminal connected to the driving amplifier circuit for receiving the amplified version of the first supply voltage, a source terminal that receives the second supply voltage, and a drain terminal that outputs a first control signal;
a second transistor having a gate terminal connected to the driving amplifier circuit for receiving the amplified version of the first supply voltage, a source terminal connected to the drain terminal of the first transistor for receiving the first control signal, and a drain terminal that outputs a second control signal;
a third transistor having a gate terminal that receives the first supply voltage, and a drain terminal that outputs a third control signal, wherein the first and second transistors are OFF and the third transistor is ON when the first supply voltage is activated; and
an amplification circuit connected to the drain terminals of the second and third transistors for receiving the second and third control signals, respectively, and generating a power-down signal, wherein the power-down signal is activated when the first supply voltage is deactivated.

2. The power-down signal generating circuit of claim 1, wherein each of the first and second transistors is a p-channel metal oxide semiconductor (PMOS) transistor and the third transistor is an n-channel metal oxide semiconductor (NMOS) transistor.

3. The power-down signal generating circuit of claim 1, wherein a voltage level of the first supply voltage is lower than a voltage level of the second supply voltage.

4. The power-down signal generating circuit of claim 1, wherein the driving amplifier circuit comprises:
a differential amplifier circuit that receives the first and second supply voltages and a feedback signal, and generates an intermediate signal;
a common source amplifier that receives the intermediate signal and the second supply voltage, and outputs the amplified version of the first supply voltage; and
a resistor divider that receives the amplified version of the first supply voltage and generates the feedback signal.

5. The power-down signal generating circuit of claim 4, wherein the differential amplifier circuit further comprises:
fourth and fifth transistors having gate terminals connected to each other, and source terminals that receive the second supply voltage, wherein a drain terminal of the fourth transistor is connected to its gate terminal, and a drain terminal of the fifth transistor provides the intermediate signal;

sixth and seventh transistors having gate terminals that receive the first supply voltage and the feedback signal, respectively, and source terminals connected to each other, wherein drain terminals of the sixth and seventh transistors are connected to the drain terminals of the fifth and fourth transistors, respectively; and a tail current source that receives the first supply voltage and outputs a tail current to the source terminals of the sixth and seventh transistors.

6. The power-down signal generating circuit of claim 5, wherein the tail current source comprises:

an eighth transistor having a drain terminal connected to the drain terminals of the sixth and seventh transistors, and a gate terminal that receives the first supply voltage; and a ninth transistor having a drain terminal connected to a source terminal of the eighth transistor, a source terminal connected to ground, and a gate terminal that receives the first supply voltage.

7. The power-down signal generating circuit of claim 5, wherein the fourth and fifth transistors are p-channel metal oxide semiconductor (PMOS) transistors, and the sixth and seventh transistors are n-channel metal oxide semiconductor (NMOS) transistors.

8. The power-down signal generating circuit of claim 5, wherein the common source amplifier comprises a transistor having a source terminal that receives the second supply voltage, a gate terminal connected to the drain terminals of the fifth and seventh transistors for receiving the intermediate signal, and a drain terminal connected to the resistor divider, wherein the amplified version of the first supply voltage is provided at said drain terminal.

9. The power-down signal generating circuit of claim 1, wherein the amplification circuit comprises:

a first inverter that is connected to the drain terminals of the second and third transistors for receiving the second and third control signals, respectively, and generates a fourth control signal; and a second inverter that is connected to the first inverter for receiving the fourth control signal, and generates the power-down signal.

10. The power-down signal generating circuit of claim 1, further comprising:

a first electro-static discharge (ESD) circuit connected between the first supply voltage and the driving amplifier circuit;

a second ESD circuit connected between the second supply voltage and a node between the drain and source terminals of the first and second transistors, and a node between the drain terminals of the second and third transistors;

a fourth transistor having a source terminal that receives the first control signal and a gate terminal connected to the node between the drain terminals of the second and third transistors; and a fifth transistor having a source terminal connected to a drain terminal of the fourth transistor, a drain terminal connected to ground, and a gate terminal connected to the second ESD circuit.

11. The power-down signal generating circuit of claim 1, wherein the power-down signal generating circuit is part of an IO ring of an integrated circuit, and the power down signal powers down the IO ring.

12. A power-down signal generating circuit, comprising:

a driving amplifier circuit, comprising:

a differential amplifier circuit that receives first and second supply voltages and a feedback signal, and generates an intermediate signal;

a common source amplifier that receives the intermediate signal and the second supply voltage, and outputs an amplified version of the first supply voltage; and a resistor divider that receives the amplified version of the first supply voltage and outputs the feedback signal;

a first transistor having a gate terminal connected to the driving amplifier circuit for receiving the amplified version of the first supply voltage, a source terminal for receiving the second supply voltage, and a drain terminal for outputting a first control signal;

a second transistor having a gate terminal connected to the driving amplifier circuit for receiving the amplified version of the first supply voltage, a source terminal connected to the drain terminal of the first transistor for receiving the first control signal, and a drain terminal for outputting a second control signal;

a third transistor having a gate terminal for receiving the first supply voltage, and a drain terminal for outputting a third control signal, wherein the first and second transistors are turned off and the third transistor is turned on when the first supply voltage is activated; and an amplification circuit that is connected to the drain terminals of the second and third transistors for receiving the second and third control signals, respectively, and generates a power-down signal, wherein the power-down signal is activated when the first supply voltage is deactivated.

13. The power-down signal generating circuit of claim 12, wherein each of the first and second transistors are p-channel metal oxide semiconductor (PMOS) transistors and the third transistor is an n-channel metal oxide semiconductor (NMOS) transistor.

14. The power-down signal generating circuit of claim 12, wherein a voltage level of the first supply voltage is lower than a voltage level of the second supply voltage.

15. The power-down signal generating circuit of claim 12, wherein the differential amplifier circuit comprises:

fourth and fifth transistors having gate terminals connected to each other, and source terminals that receive the second supply voltage, wherein a drain terminal of the fourth transistor is connected to its gate terminal, and a drain terminal of the fifth transistor generates the intermediate signal;

sixth and seventh transistors having gate terminals that receive the first supply voltage and the feedback signal, respectively, and source terminals connected to each other, wherein drain terminals of the sixth and seventh transistors are connected to the drain terminals of the fifth and fourth transistors, respectively; and a tail current source that receives the first supply voltage and outputs a tail current to a node between the source terminals of the sixth and seventh transistors.

16. The power-down signal generating circuit of claim 15, wherein the fourth and fifth transistors are p-channel metal oxide semiconductor (PMOS) transistors, and the sixth and seventh transistors are n-channel metal oxide semiconductor (NMOS) transistors.

17. The power-down signal generating circuit of claim 12, wherein the amplification circuit includes:
- a first inverter that is connected to the drain terminals of the second and third transistors for receiving the second and third control signals, respectively, and generates a fourth control signal; and
- a second inverter that is connected to the first inverter for receiving the fourth control signal, and generates the power-down signal.

18. The power-down signal generating circuit of claim 12, wherein the power-down signal generating circuit is located within an input/output (IO) ring of an integrated circuit and the power-down signal powers down the IO ring.

* * * * *